United States Patent
Pan

(10) Patent No.: US 6,354,781 B1
(45) Date of Patent: Mar. 12, 2002

(54) SEMICONDUCTOR MANUFACTURING SYSTEM

(75) Inventor: Yang Pan, Singapore (SG)

(73) Assignee: Chartered Semiconductor Manufacturing Company, Singapore (SG)

(*) Notice: Subject to any disclaimer, the term of this patent is extended or adjusted under 35 U.S.C. 154(b) by 0 days.

(21) Appl. No.: 09/431,151

(22) Filed: Nov. 1, 1999

(51) Int. Cl.⁷ .............................................. B65G 49/07
(52) U.S. Cl. ........................................ 414/217; 414/939
(58) Field of Search ........................... 414/217, 217.1, 414/222.13, 939, 940

(56) References Cited

U.S. PATENT DOCUMENTS

| | | | |
|---|---|---|---|
| 3,845,286 A | 10/1974 | Aronstein et al. ........ 235/151.1 |
| 4,540,326 A | 9/1985 | Southworth et al. ......... 414/217 |
| 4,649,830 A * | 3/1987 | Tanaka ........................ 414/940 |
| 4,682,927 A * | 7/1987 | Southworth et al. ......... 414/940 |
| 4,826,360 A * | 5/1989 | Iwasawa et al. ............. 414/940 |
| 5,058,491 A | 10/1991 | Wiemer et al. ............. 98/115.3 |
| 5,372,241 A * | 12/1994 | Matsumoto ............ 414/222.13 |
| 5,399,531 A | 3/1995 | Wu ............................. 437/205 |
| 5,401,212 A | 3/1995 | Marvell et al. .............. 454/187 |
| 5,417,537 A * | 5/1995 | Miller ......................... 414/940 |
| 5,509,772 A * | 4/1996 | Doche ......................... 414/940 |
| 5,536,128 A | 7/1996 | Shimoyashiro et al. ..... 414/273 |
| 5,547,328 A | 8/1996 | Bonora et al. ............... 414/217 |
| 5,660,585 A | 8/1997 | Swobada et al. ............ 454/187 |
| 5,788,454 A | 8/1998 | Thompson et al. .......... 414/786 |
| 5,810,062 A | 9/1998 | Bonora et al. ............... 141/351 |
| 5,928,077 A * | 7/1999 | Kisakibura .................. 414/940 |
| 5,957,648 A * | 9/1999 | Bachrach .................... 414/940 |
| 5,964,561 A * | 10/1999 | Marohl ........................ 414/940 |
| 6,183,358 B1 * | 2/2001 | Adair, Jr. .................... 414/940 |
| 6,280,134 B1 * | 8/2001 | Nering ........................ 414/217 |

FOREIGN PATENT DOCUMENTS

| | | | | |
|---|---|---|---|---|
| DE | 197 37 839 A | | 3/1999 | |
| EP | 0 648 698 A | | 4/1995 | |
| EP | 797240 | * | 9/1997 | ................ 414/217 |
| EP | 0 848 413 A | | 6/1998 | |
| JP | 6104326 | * | 4/1994 | ................ 414/939 |
| JP | 6132186 | * | 5/1994 | ................ 414/940 |
| WO | WO 98 58402 A | | 12/1998 | |

* cited by examiner

Primary Examiner—James W. Keenan
(74) Attorney, Agent, or Firm—George O. Saile; Stephen B. Ackerman

(57) ABSTRACT

An improved manufacturing system for processing semiconductor wafers which includes a (1) plurality of processing stations, (2) a sealed transport tunnel located directly over the processing stations, (3) a transport to move wafers within the tunnel, (4) interconnection chambers joining the transport tunnel and the processing stations, (5) interface mechanisms in the interconnection chambers to move the wafers to and from the processing stations, and (6) a computer to control the operations of the transport, the interface mechanisms, and the processing equipment at the processing stations.

11 Claims, 2 Drawing Sheets

SEMICONDUCTOR MANUFACTURING SYSTEM

BACKGROUND OF THE INVENTION (1) Field of the Invention

The present invention relates in general to automated manufacturing of integrated circuit semiconductor devices and more particularly to an automated system where each wafer is handled as a single unit, as contrasted to the more conventional batch processing.

(2) Description of the Prior Art

In the manufacture of semiconductor devices, a circular monocrystalline semiconductor wafer, most typically formed of monocrystalline silicon, is subjected to a large number of processes steps. These process steps include oxidation of the surface to form silicon dioxide insulating layers, deposition of polycrystalline silicon and/or metallic layers, diffusion and/or ion implantation of dopants into selected areas, lithography/masking/etching operations, etching of the various layers mentioned above, heat treating and other steps that are well known to those skilled in the art. A multitude of extremely small and complex electrical circuits are thus formed on the semiconductor wafer through these process steps. As the technology has progressed, the wafers have been made larger and the feature size of the elements of the circuitry on the wafer's surface have been greatly decreased. This progress has also lead to increasingly faster circuits.

As the size of the circuitry has decreased, airborne contamination becomes responsible for a serious yield problem. Since the integrated circuitry formed upon the silicon wafer is extremely small with feature size on the order of micrometers or submicrometers, it only takes a very small sized particle to either short circuit or cause an open in the formed circuitry. Also, such a particle can block processing chemicals from reaching every portion of the circuitry on the wafer during critical processing steps. Some contamination particles can cause incomplete etching in spaces between lines, thus leading to an unwanted electrical bridge. In addition to such physical defects, other contamination particles may cause electrical failure due to induced ionization or trapping centers in gate dielectric layers.

The main sources of particulate contamination are manufacturing line workers, equipment, and chemicals. Particules given off by workers in the area are transmitted through the environment, and through physical contact or migration onto the wafer surfaces. People, by shedding of skin flakes, for example, are a significant source of particles that are easily ionized and cause defects. It has been found that as many as 6000 particles per minute are emitted into and adjacent a cubic foot of space by a fully suited operator.

An early effort to overcome the contamination problem was to process semiconductor devices in clean rooms with HEPA of ULPA recirculating air systems with suited operators. This procedure is quite expensive and not always effective, particularly in the present era of submicrometer feature size. Although clean room garments reduce particle emissions they do not fully contain the emissions. Also, it is inconvenient and uncomfortable to the operators to remain fully suited at their work throughout the entire work shift.

Movement of semiconductor wafers through the fabrication system for integrated semiconductor devices have long used a cassette system to handle wafers. The wafers are carried in cassettes from processing machine to processing machine. There are many wafers in each cassette. The disadvantage of the cassette system is that the wafers are batch processed, since the cassette is designed to hold many wafers. The cycle time for each wafers then becomes long. This adds to the cost, since a greater inventory is tied up for a longer time. Also, the response time to meet varying customer requirements is long. In addition, the friction between the wafer and the cassette can create particles when the wafers are loaded and unloaded. This contamination occurs in the clean environment and remains there. Still further, the batch transportation of wafers in a cassette or carrier opens the entire batch of wafers to damage from shock loads.

There is a pressing need for a fully automated semiconductor manufacturing system where single wafers are moved between processing stations without exposure to particle laddened air. U.S. Pat. No. 4,540,326 discloses a system for transporting wafers between processing stations where a clean environment is maintained. However, the wafers are loaded and unloaded into a cassette mounted on a cart. This system, however, is a batch operation with the aforedescribed disadvantages. U.S. Pat. No. 3,845,286 describes a wafer processing system wherein single wafers are transported to various processing stations with a transport mechanism. While the broad concept of individual wafer processing is disclosed, the problems concerning contamination are not addressed. U.S. Pat. No. 5,399,531 discloses and claims a manufacturing system for processing individual SC wafers which includes plurality of enclosed processing stations, a tunnel that communicates with the processing stations, a means to move wafers between the stations, and a interface mechanism that moves the wafers from the tunnel to the station.

It should be pointed out that current wafer transport systems occupy large areas of clean room which increases wafer manufacturing cost significantly. One of the key features of this invention is to build the wafer transport and wafer storage area on the top of processing apparatus. By doing so, the clean room area will be used much more effectively.

SUMMARY OF THE INVENTION

It is an object of the present invention to provide an improved IC semiconductor manufacturing system that has an improved arrangement of the elements thereof.

Another object to the present invention is to provide an improved manufacturing system where there is better access to the process stations for servicing.

Another object of the present invention is to provide an improved manufacturing system where clean room space will be utilized more effectively by locating the wafer transport system on the top of the processing equipment.

Yet another object of the present invention is to provide an improved manufacturing system that provides a better arrangement of the wafer delivery system.

In accordance with the above objects, there is provided an improved manufacturing system for individually processing semiconductor wafers which includes, a plurality of processing stations, each having an enclosure that is capable of maintaining a controlled clean environment with at least one processing apparatus contained within the enclosure, and a sealed transport tunnel adapted to maintain a controlled clean environment within, with the tunnel located directly above the plurality of processing stations. Interconnection chambers that are adapted to maintain a clean environment within are joined to the tunnel and to the respective enclosures. Interface mechanisms to move wafers are provided in each chamber to move wafers between the tunnel and the processing apparatus in the enclosures.

DESCRIPTION OF THE PREFERRED EMBODIMENTS

Figure 1:
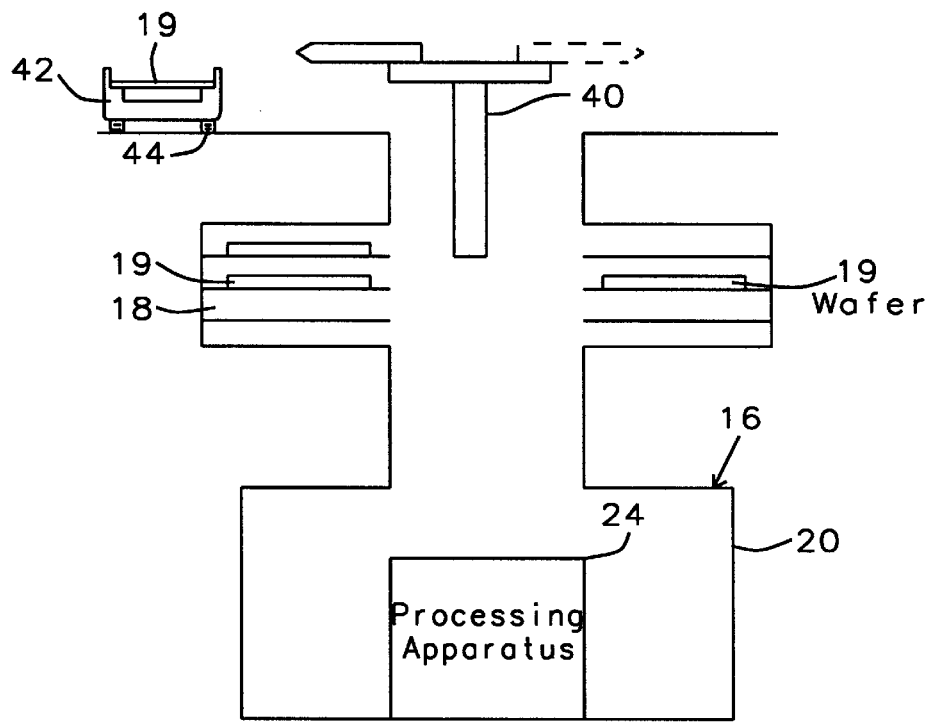
FIG. 1 is an elevational, schematic view of the manufacturing system of the invention that illustrates the elements of the system and their positional relationship.
Figure 3:
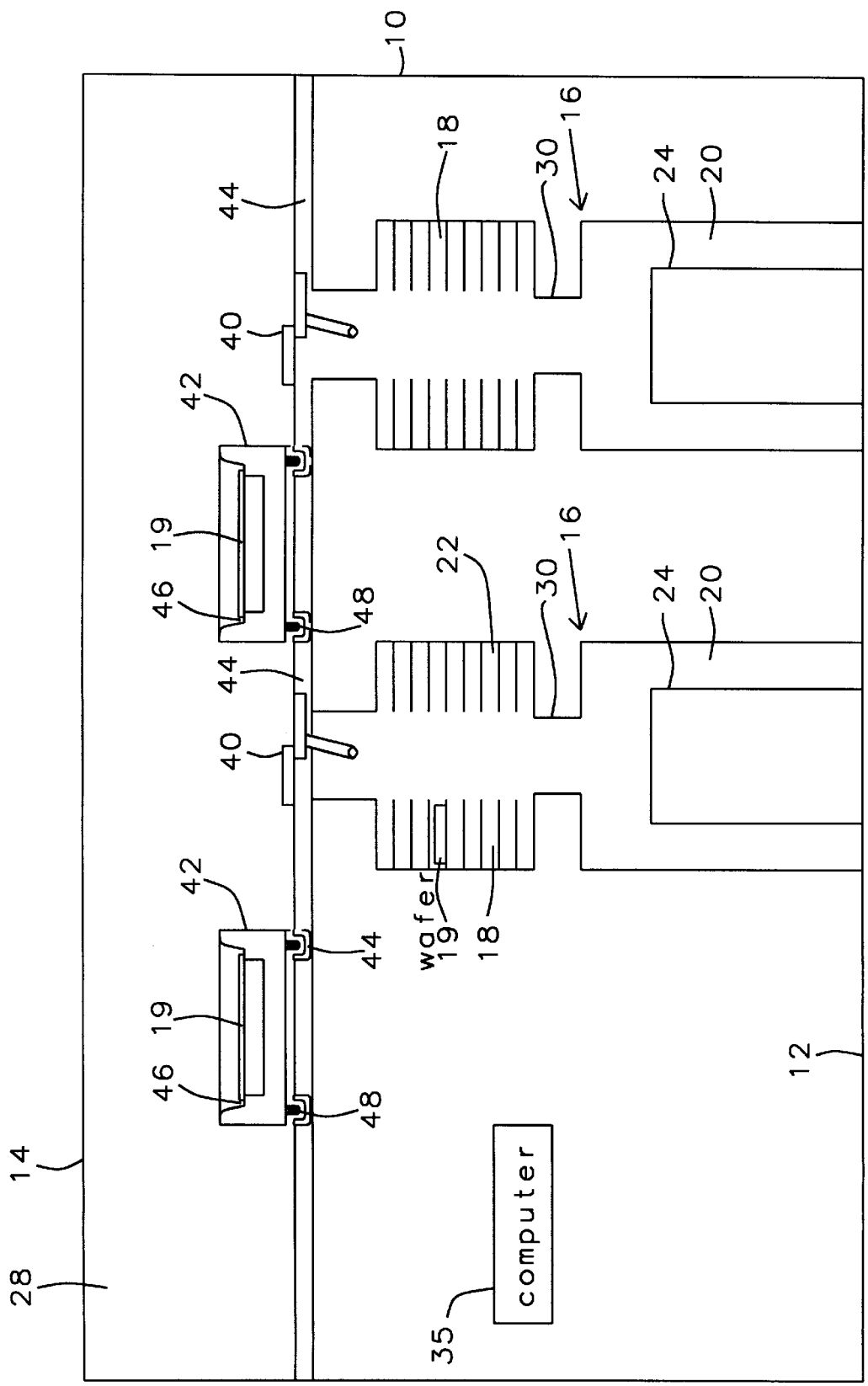
FIG. 3 is an elevational view of the manufacturing system of the invention that illustrates several processing apparatus and their arrangement.

Referring now to the Fig's of the drawing, there is illustrated a diagrammatic elevational view of the elements of the manufacturing system of the invention. The system 10 is shown that is adapted to process semiconductor wafers individually to produce integrated circuit semiconductor devices. As shown in FIG. 3, a building having a lower floor 12 and a ceiling 14 contains a plurality of semiconductor processing stations 16. Only a single station is indicated in FIG. 1 on the drawing, but it is understood that many more can be provided, as indicated in FIG. 3. The number of processing stations is dictated by the number of operations that are necessary to fabricate the devices. Each of the processing stations include an enclosure 20, that is capable of maintaining a controlled clean environment suitable for processing semiconductor devices. Each enclosure houses at least one processing apparatus 24, that is capable of performing a processing step on a wafer.

As indicated in FIG. 3, a sealed transport tunnel 28 is located in building 10, supported by the ceiling, and positioned directly over enclosure 20 of processing station 16. Tunnel 28 is also capable of maintaining a controlled clean environment within. Interconnection chamber 30 can alternatively occupy the entire area of the ceiling over the processing apparatus. Interconnection chamber 30 is joined to tunnel 28 and to enclosure 20, respectively. The chamber is also capable of maintaining a clean environment within. Within chamber 30, is provided suitable interface mechanisms, each comprised of buffers and a robot that are controlled by a computer. The interface mechanisms can be any suitable mechanism that can move wafers between tunnel 28 and the processing apparatus 24. A typical apparatus is a robot that can be controlled with a computer program. The apparatus will also include a buffer to store wafers at the processing stations, both before and after they are processed by the processing apparatus. Within the transport tunnel 28 there is provided a suitable means to move wafers to be processed from one process station to another. This means to move wafers will interact with the interface mechanisms. The system will also include a mechanism to maintain a super clean environment within the transport tunnel 28, the enclosure 20, and the interconnection chamber 30. These mechanisms are well known in the art and consisting of air pumps that re-circulate air through suitable air filters. All of the operations described above are preferably controlled by a master computer 25. The computer can be programmed to track each wafer being processed, operate the means to move the wafers between processing stations 16 in the transport tunnel 28, operate the interface mechanisms 34 contained in the interconnection chambers 30, including the buffers, and also control the operation of processing apparatus 24 in enclosures 20.

A very significant feature of the system of the invention is the locating of the transport tunnel directly over the processing stations. This arrangement leaves the floor space on the lower floor largely unencumbered. The processing stations can more easily be serviced with transport tunnel and the connecting chambers out of the way.

A preferred interface mechanism 34, as shown in FIG. 1, has a wafer storage section located above the enclosure 20 enclosing processing apparatus 24. One buffer area 18 has movable holders for supporting a plurality of input wafers 19 to be processed, that can be accessed from inside of chamber 30. A second buffer area 22 also has wafer holders for supporting a plurality of output wafers 19 that have been processed in processing apparatus 24. Buffer areas 18 and 22 serve as buffers for holding wafers arriving to be processed, and wafers that have been processed at apparatus 24, and are awaiting transport to the next processing station. A suitable robot 40, shown schematically, is located in tunnel 28 and is provided to move wafers between the buffers and the processing apparatus 24. More than one robot can be provided at each station. For example, one robot can be used to transport the inputted wafers, and a second robot for transporting the output wafers. The wafers 19 are moved vertically through interconnection chamber 30 into and out of the buffers 18 and 22, to processing apparatus 24 in chamber 20. The robot 40 is adapted to transport wafers to and from wafer carrier 42, supported on tracks 44. The wafer carrier 42 is provided to move wafers between processing stations and is located in tunnel 28. In operation, the wafer carrier 42 will pick up a wafer to be processed at a loading station, not shown, and transport it to the processing station that is to perform the first processing operation. The robot at the station will remove the wafer from the carrier 42 and place it in either the input buffer 18 or take it directly to the processing apparatus 24. The robot 40 may remove a wafer 19 from output buffer 22, or the processing apparatus for transport to another processing station. A mechanism is provided for checking the identity and status of the wafer 19 delivered to the station, and also when it is removed. The operation of the entire processing system is controlled by a system computer which directs the operation of the wafer carrier 42, the robot 40, the mechanism for checking the wafer identity, and the processing apparatus 24.

Figure 2:
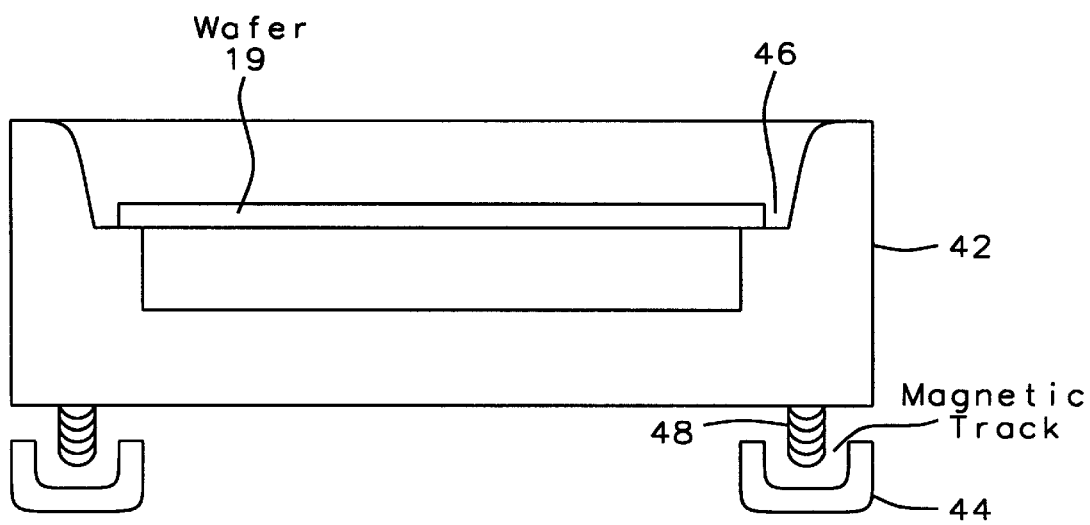
FIG. 2 is an elevational view of a preferred embodiment of the wafer carrier of the invention.

In FIG. 2 there is depicted a preferred embodiment of the wafer carrier 42. As shown, the wafer carrier is provided with a shoulder 46 that provides a support for wafer 19 along its peripheral surface. The carrier 42 is preferably supported on a magnetic track 44 using magnets 48 positioned on the bottom surface. The track 44, located in tunnel 28, has intersecting tracks which enable the carrier to reach any processing station in the system. Any suitable mechanism can be used to propel the carrier along track 44 in response to a command from the system computer.

The manufacturing system to the invention, having the aforedescribed arrangement with the transport system and wafer buffers located above the processing apparatus, results in much improved access for to the processing apparatus for maintenance and observation. The arrangement enables more efficient apparatus arrangement and makes more efficient use of existing manufacturing space. The maintenance cost of the system is reduced because of the improved access.

While the invention has been particularly shown and described with reference to a preferred embodiment thereof, it will be understood by those skilled in the art that changes in form and detail may be made therein without departing from the spirit and scope of the invention.

I claim:

1. A manufacturing system for handling and individually processing semiconductor wafers through a plurality of processing stations that perform operations on semiconductor wafers to produce operable integrated circuit semiconductor devices comprising:

a plurality of processing stations, each having an enclosure that is capable of maintaining a controlled clean environment, with at least one processing apparatus contained within each of said enclosures, a sealed transport tunnel adapted to maintain a controlled clean environment within, said tunnel located directly above said plurality of processing stations, interconnection chambers that are adapted to maintain a clean environment within, each of said chambers connected to the top of one of said enclosures of said processing stations, and to said transport tunnel, an interface mechanism within each of said chambers to transfer wafers to and from said processing apparatus within said enclosure, and said transport tunnel, a means to move wafers to be processed between the said interface mechanisms in said chambers, and through said transport tunnel, and a means to maintain controlled clean environments in said (1) enclosures of said processing stations, (2) said transport tunnel, and (3) said interconnection chambers.

2. The manufacturing system of claim 1, wherein said processing stations are housed in a manufacturing building having a lower floor and a ceiling, said processing stations are located on a said lower floor of a manufacturing building, and said transport tunnel is located on the said ceiling of said building.

3. The manufacturing system of claim 1, wherein a master control system is provided that tracks each wafer being processed and moves the wafers through the system by activating said (1) means to move wafers through the transport tunnel, (2) the interface mechanisms, and (3) the processing apparatus.

4. The manufacturing system of claim 1, wherein said interface mechanisms each include a (1) buffer to store wafers to be processed at the processing station, and (2) a buffer to store processed wafers from the associated processing apparatus while awaiting removal by said means to move wafers through said transport tunnel.

5. The manufacturing system of claim 4, wherein said buffers to store wafers to be processed, and said buffers to store processed wafers are located in said interconnection chambers.

6. The manufacturing system of claim 5, wherein said means to move wafers is a robot.

7. The manufacturing system of claim 5, wherein said means to move wafers is comprised of (1) a first robot provided to move wafers from said sealed tunnel, to said buffer to store wafers, to said processing apparatus, and (2) a second robot provided to move wafers after being processed from said processing apparatus to said buffers to store processed wafers, to said tunnel.

8. The manufacturing system of claim 7, wherein a system computer is provided to control the operation of the wafer carrier, said first and second robots, and said processing apparatus.

9. The manufacturing system of claim 1, wherein said means to move wafers is comprised of a wafer carrier, and a track in said transport tunnel that has access to all of said processing apparatus of said manufacturing system.

10. The manufacturing system of claim 8, wherein said track is a magnetic track, and said wafer carrier has a plurality of magnets that support the carrier over said magnetic track.

11. The manufacturing system of claim 10, wherein said wafer carrier has a shoulder that provides a support for a wafer on the bottom peripheral area of the wafer.

* * * * *